US012696516B2

(12) United States Patent
Qin et al.

(10) Patent No.:  US 12,696,516 B2
(45) Date of Patent:  Jul. 28, 2026

(54) SEMICONDUCTOR STRUCTURE WITH TWO AIR GAPS ON TWO SIDES OF A TOP SOURCE-DRAIN MIDDLE-OF-LINE CONTACT VIA

(71) Applicant: International Business Machines Corporation, Armonk, NY (US)

(72) Inventors: Liqiao Qin, Albany, NY (US); Tao Li, Slingerlands, NY (US); Ruilong Xie, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 18/529,195

(22) Filed: Dec. 5, 2023

(65) Prior Publication Data

US 2025/0185337 A1     Jun. 5, 2025

(51) Int. Cl.
| | |
|---|---|
| *H10D 64/23* | (2025.01) |
| *H10W 10/00* | (2026.01) |
| *H10W 10/20* | (2026.01) |
| *H10W 20/41* | (2026.01) |

(52) U.S. Cl.
CPC ........ *H10D 64/254* (2025.01); *H10W 10/021* (2026.01); *H10W 10/20* (2026.01); *H10W 20/427* (2026.01)

(58) Field of Classification Search
CPC .. H10D 64/254; H10W 10/20; H10W 10/021; H10W 20/427
See application file for complete search history.

(56) References Cited

U.S. PATENT DOCUMENTS

| | | | |
|---|---|---|---|
| 9,666,533 | B1 | 5/2017 | Basker |
| 11,664,280 | B2 | 5/2023 | Chen |
| 2020/0161439 | A1* | 5/2020 | You .................... H10D 30/6219 |
| 2021/0083114 | A1* | 3/2021 | Wang .................. H10D 30/797 |
| 2022/0093448 | A1 | 3/2022 | Yu |
| 2022/0406715 | A1 | 12/2022 | Xie |
| 2023/0077243 | A1 | 3/2023 | Xie |
| 2023/0089482 | A1 | 3/2023 | Zhang |
| 2023/0099965 | A1 | 3/2023 | Dutta |

OTHER PUBLICATIONS

Cheng, K. et al., "Improved Air Spacer for Highly Scaled CMOS Technology," in IEEE Transactions on Electron Devices, vol. 67, No. 12, pp. 5355-5361, Dec. 2020, doi: 10.1109/TED.2020. 3031878.
Horiguchi, N. et al. (2020). "A View on the Logic Technology Roadmap." Semiconductor Digest, Aug./Sep. 2020, vol. 2 No. 6. pp. 12-17. https://magazine.semiconductordigest.com/html5/reader/ production/default.aspx?pubname=&edid=a58da11a-3cca-46dd-930c-ed28ab9ac1ff <Retrieved Aug. 23, 2023>.
Li, T. et al., "Self-Aligned Wafer Backside Gate Signal with Airgap," Filed Sep. 29, 2022, U.S. Appl. No. 17/955,974.

* cited by examiner

*Primary Examiner* — Richard A Booth
(74) *Attorney, Agent, or Firm* — Kimberly Zillig

(57)     ABSTRACT

A semiconductor structure that includes a top source/drain (S/D) middle-of-line (MOL) contact via including a first side and a second side. The semiconductor structure also includes a first air gap located adjacent the first side of the top S/D MOL contact via, and a second air gap located adjacent the second side of the top S/D MOL contact via.

20 Claims, 19 Drawing Sheets

100

X-X          Y-Y

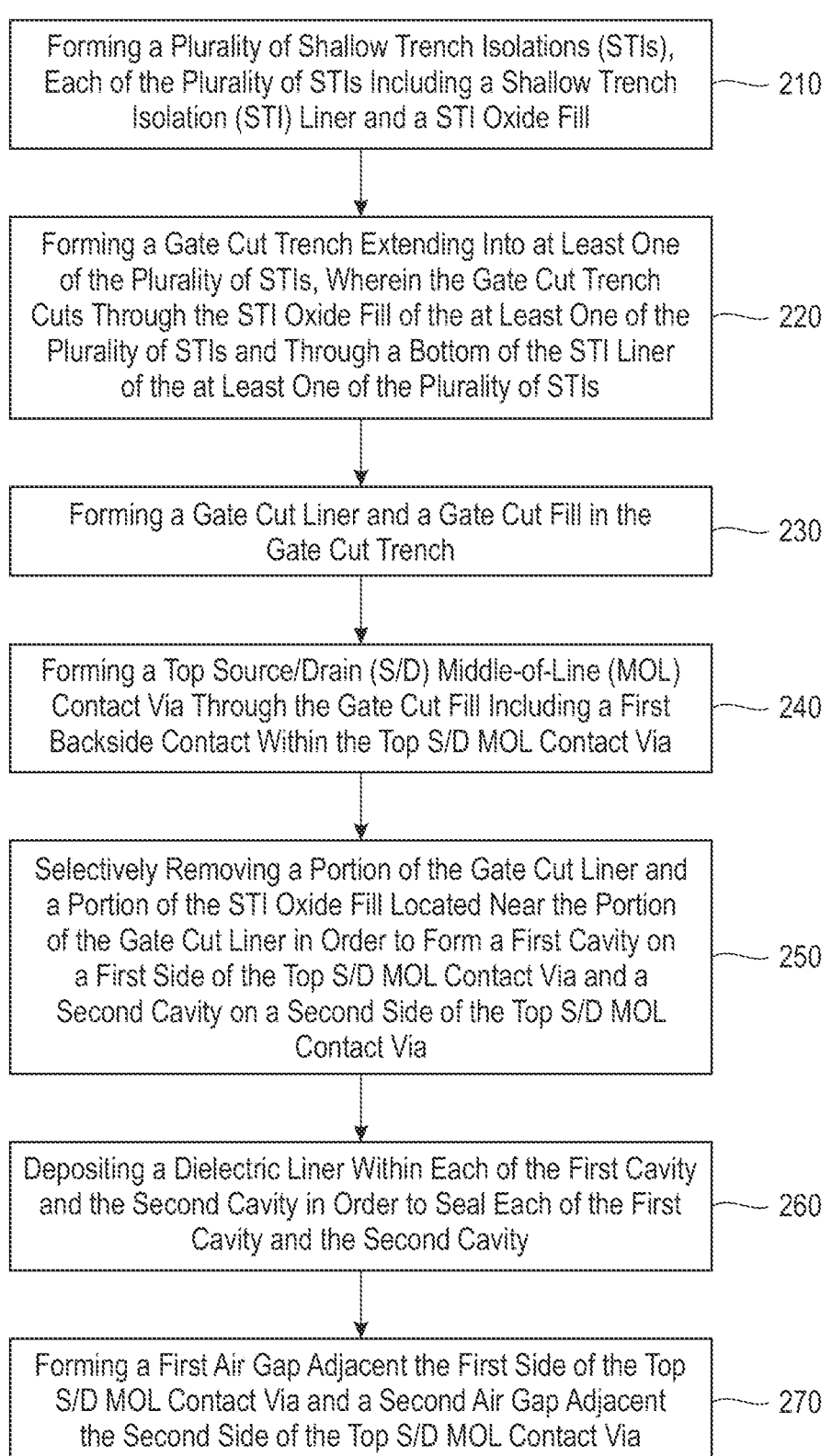

200

Forming a Plurality of Shallow Trench Isolations (STIs), Each of the Plurality of STIs Including a Shallow Trench Isolation (STI) Liner and a STI Oxide Fill —— 210

Forming a Gate Cut Trench Extending Into at Least One of the Plurality of STIs, Wherein the Gate Cut Trench Cuts Through the STI Oxide Fill of the at Least One of the Plurality of STIs and Through a Bottom of the STI Liner of the at Least One of the Plurality of STIs —— 220

Forming a Gate Cut Liner and a Gate Cut Fill in the Gate Cut Trench —— 230

Forming a Top Source/Drain (S/D) Middle-of-Line (MOL) Contact Via Through the Gate Cut Fill Including a First Backside Contact Within the Top S/D MOL Contact Via —— 240

Selectively Removing a Portion of the Gate Cut Liner and a Portion of the STI Oxide Fill Located Near the Portion of the Gate Cut Liner in Order to Form a First Cavity on a First Side of the Top S/D MOL Contact Via and a Second Cavity on a Second Side of the Top S/D MOL Contact Via —— 250

Depositing a Dielectric Liner Within Each of the First Cavity and the Second Cavity in Order to Seal Each of the First Cavity and the Second Cavity —— 260

Forming a First Air Gap Adjacent the First Side of the Top S/D MOL Contact Via and a Second Air Gap Adjacent the Second Side of the Top S/D MOL Contact Via —— 270

FIG. 19

SEMICONDUCTOR STRUCTURE WITH TWO AIR GAPS ON TWO SIDES OF A TOP SOURCE-DRAIN MIDDLE-OF-LINE CONTACT VIA

BACKGROUND

The present disclosure relates to fabrication methods and resulting structures for semiconductor devices. More particularly, the present disclosure provides methods and resulting semiconductor structures including a field effect transistor (FET).

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

SUMMARY

According to some embodiments of the disclosure, there is provided a semiconductor structure. The semiconductor structure includes a top source/drain (S/D) middle-of-line (MOL) contact via including a first side and a second side. The semiconductor structure also includes a first air gap located adjacent the first side of the top S/D MOL contact via, and a second air gap located adjacent the second side of the top S/D MOL contact via.

According to some embodiments of the disclosure, there is provided a semiconductor structure that includes a top source/drain (S/D) middle-of-line (MOL) contact via including an upper portion and a lower portion adjacent a backside contact. The semiconductor structure also includes a dielectric material layer located adjacent the upper portion of the top S/D MOL contact via on a first side and a second side of the top S/D MOL contact via. The semiconductor structure further includes a first air gap and a second air gap located adjacent the first side and the second side of the top S/D MOL contact via along the lower portion of the top S/D MOL contact via.

According to some embodiments of the disclosure, there is provided a method of forming a semiconductor structure. The method includes an operation of forming a plurality of shallow trench isolations (STIs), each of the plurality of STIs including a shallow trench isolation (STI) liner and a STI oxide fill. Another operation is forming a gate cut trench extending into at least one of the plurality of STIs, wherein the gate cut trench cuts through the STI oxide fill of the at least one of the plurality of STIs and through a bottom of the STI liner of the at least one of the plurality of STIs. A further operation is forming a gate cut liner and a gate cut fill in the gate cut trench. Yet another operation is forming a top source/drain (S/D) middle-of-line (MOL) contact via through the gate cut fill including a first backside contact within the top S/D MOL contact via. An additional operation is selectively removing a portion of the gate cut liner and a portion of the STI oxide fill located near the portion of the gate cut liner in order to form a first cavity on a first side of the top S/D MOL contact via and a second cavity on a second side of the top S/D MOL contact via. Another operation is depositing a dielectric material liner within each of the first cavity and the second cavity in order to seal each of the first cavity and the second cavity. Yet another operation is forming a first air gap adjacent the first side of the top S/D MOL contact via and a second air gap adjacent the second side of the top S/D MOL contact via.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 19 illustrates a flow diagram of a method of forming a semiconductor structure, in accordance with embodiments of the disclosure.

Figure 1:
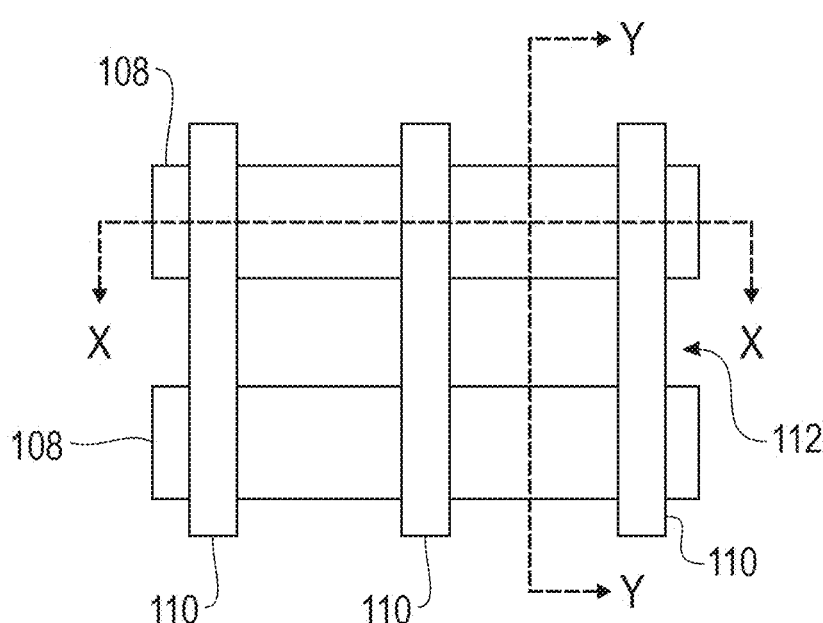
FIG. 1 illustrates a top view of an integrated circuit (IC) structure disclosed herein and includes locations of where two cross-sections are taken (at X-X and at Y-Y) that are shown in cross-sectional views in the following FIGS. 2-8, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate generally to fabrication methods and resulting structures for semiconductor devices. More particularly, the present disclosure provides a semiconductor structure with first and second air gaps that are located on first and second sides, respectively, of a top source/drain (S/D) middle-of-line (MOL) contact via (otherwise known as a "deep via"). While the present disclosure is not necessarily limited to such applications, various aspects of the disclosure can be appreciated through a discussion of various examples using this context.

The scaling down process of integrated circuit (ICs) generally provides benefits by increasing production efficiency and lowering associated costs. Such scaling down has also increased the complexity of processing and manufacturing ICs. Hence, semiconductor manufacturing processes can use continued improvements. One area of improvement is how to reduce parasitic capacitance among features of field effect transistors (FETs), for example.

It can be desirable to reduce parasitic capacitance between metal features, such as metal lines and/or metal plugs, in order to increase switching speed, decrease switching power consumption, and/or decrease coupling noise of ICs. It is desired to have low-k dielectric materials surrounding signal lines to reduce resistive-capacitance delay. Certain low-k materials have been suggested as insulator materials to reduce parasitic capacitance. However, as semiconductor technology progresses to smaller geometries, the distances between the metal features are further reduced, which increases parasitic capacitance. Therefore, there is a need for improved approaches in semiconductor fabrication.

A stacked FET structure includes a connection between a top FET source/drain (S/D) and a backside power delivery network. Embodiments of the disclosure have an advantage of including air gaps between a bottom S/D backside contact and a top S/D MOL via contact that can benefit device performance by reducing parasitic capacitance. Embodiments of the disclosure utilize air gaps rather than a low-k dielectric material, for example, that can also eliminate a need to include space for a layer of dielectric material. Embodiments of the disclosure include air gaps, which effectively have a much lower k value compared to dielectric fill materials in order to reduce parasitic capacitance.

A process flow herein can include forming dummy gates on a stacked field-effect transistor (FET), including a nanosheet with crystalline layers; removing a first sacrificial silicon germanium (SiGe) layer having a germanium atomic percentage of 60; replacing the first sacrificial layer with a first spacer layer, i.e., a bottom dielectric isolation (BDI) layer; forming an inner, or middle, spacer layer in the nanosheet, i.e., middle dielectric isolation (MDI); forming a placeholder, along with source/drain (S/D) epis; forming a first interlayer dielectric (ILD) layer; removing the dummy gates and SiGe; forming a replacement high-k metal gate (HKMG); depositing a second ILD layer; forming a gate cut using gate cut patterning; filling the gate cut with a bi-layer; patterning of a self-aligned, deep via in the bi-layer; patterning to form a plurality of contact openings; forming a top S/D middle-of-line (MOL) contact via using metallization; forming additional metal contacts; forming a back end-of-line (BEOL) layer; bonding a carrier wafer to the device; flipping the carrier wafer with substrate removal to an etch stop layer; removing the etch stop layer (ESL); depositing a backside ILD (BILD) layer followed by chemical mechanical planarization (CMP); removing the placeholder forming a backside contact where the placeholder was removed, followed by CMP; dielectric material "pull" or removal, and nearby shallow trench isolation (STI) removal, from a lower portion of the top S/D MOL contact via; depositing dielectric material liners by atomic layer deposition (ALD) to pinch off, or close, air gaps on two sides of the lower portion of the top S/D MOL contact via, followed by an etch back; and forming a backside power rail (BPR) and a backside power power-delivery network (BPPDN).

Shallow trench isolation (STI) is an IC feature that can prevent electric current leakage between adjacent semiconductor device components.

An "air gap" can be defined as an air-filled gap or space. "Air" can be an individual or a mixture of gases, such as oxygen or nitrogen, for example.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

It is to be understood that the present disclosure will be described in terms of a given illustrative architecture; however, other architectures, structures, substrate materials and process features and steps/blocks can be varied within the scope of the present disclosure. It should be noted that certain features cannot be shown in all figures for the sake of clarity. This is not intended to be interpreted as a limitation of any particular embodiment, or illustration, or scope of the claims.

Exemplary embodiments of the disclosure will now be discussed in further detail with regard to semiconductor devices and methods of manufacturing the same and, in particular, to form air gaps on first and second sides of a lower portion of a top S/D MOL contact via.

FIG. 1 illustrates a top view of a semiconductor structure 100 disclosed herein that contains a simplistic plan view of a semiconductor structure 100. The figure depicts locations where cross-sectional views, as depicted in FIGS. 2-8 (at X-X and at Y-Y), were taken. The figure also includes some components of the semiconductor structure 100 for reference, which are discussed below with regard to FIGS. 2-8. FIGS. 2-8 each illustrate the two cross-sectional views of the semiconductor structure 100 of FIG. 1, taken at X-X and Y-Y (as shown in FIG. 1), with the two views (X-X and Y-Y) shown side-by-side, and taken at various operations in a process to form the semiconductor structure 100 described herein.

Turning to the subsequent figures, FIGS. 2-8 (and FIGS. 10-18) include schematic illustrations of cross-sectional views of the semiconductor structure 100 through operations or steps of an example manufacturing process. The attached drawings present various views of one illustrative embodiment of a process or method to make the semiconductor structure 100. The left side of each of FIGS. 2-8 shows a cross-sectional view of the semiconductor structure 100 taken at X-X in FIG. 1 (view X-X). The right side of each of FIGS. 2-8 shows a cross-sectional view of the semiconductor structure 100 taken at Y-Y in FIG. 1 (view Y-Y).

The various layers of material depicted in the following drawings can be formed by any of a variety of different known techniques, e.g., a chemical vapor deposition (CVD) process, an ALD process, a thermal growth process, spin-coating techniques, reactive-ion etching (RIE), etc.

The terms "epitaxially," "epitaxy," "epi," etc., carry their customary usage: meaning the single crystal lattice structure carries across an interface. Typically, a single crystal material forms a platform onto which another single crystal material, with matching crystalline characteristics, can be deposited by one of several techniques known in the art. Such techniques are, for instance, molecular beam epitaxy (MBE), or various types of CVD.

Figure 2:
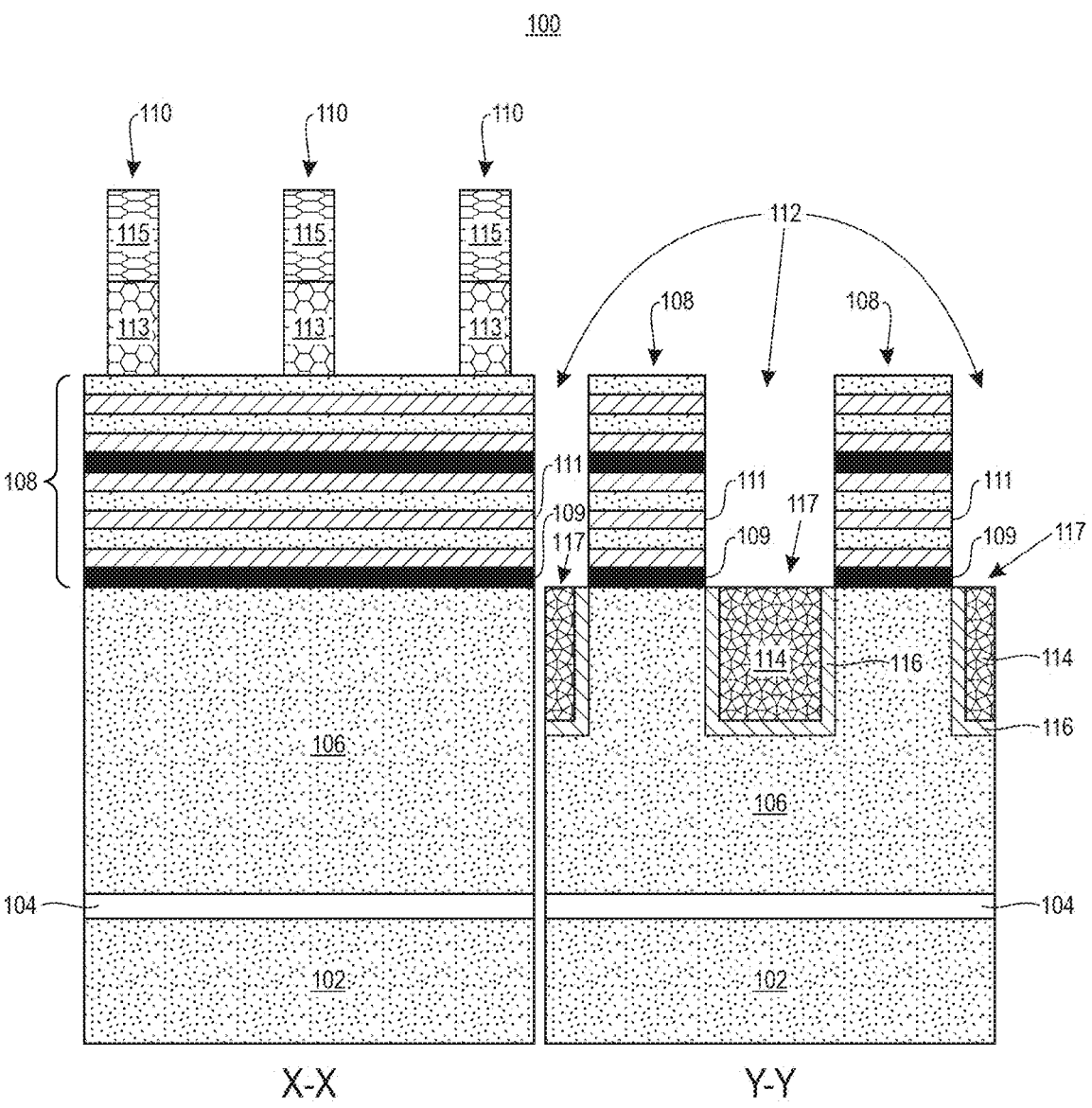
FIGS. 2-8 each illustrate two cross-sectional views of the IC structure of FIG. 1, taken at X-X and Y-Y (as shown in FIG. 1), with the two views X-X and Y-Y shown side-by-side, and taken at various operations or stages in a process or method to form the IC structure as disclosed herein, in accordance with embodiments of the disclosure.

FIG. 2 shows an operation in the process of manufacturing the semiconductor structure 100 that is shown after dummy gate formation. In FIG. 2, a substrate 102 is shown provided. In some embodiments, the substrate 102 can be made of silicon (Si). Alternatively, the substrate 102 can include germanium (Ge), SiGe, gallium arsenide (GaAs) or other appropriate semiconductor materials. In some embodiments, the substrate 102 can include a semiconductor-on-insulator (SOI) structure such as a buried dielectric layer. Also, alternatively, the substrate 102 can include a buried dielectric layer such as a buried oxide (BOX) layer, such as that formed by a method referred to as separation by implantation of oxygen (SIMOX) technology, wafer bonding, selective epitaxial growth (SEG), or another appropriate method. In various embodiments, the substrate 102 can include any of a variety of substrate structures and materials.

Also in FIG. 2, an etch stop layer (ESL) 104 is shown atop the substrate 102. The ESL 104 can include, for example, materials such as silicon dioxide ($SiO_2$), SiGe, or other suitable material(s). The ESL 104 can be formed, for example, by epitaxial epi growth, CVD, physical vapor deposition (PVD), ALD, or other suitable methods.

As shown in FIG. 2, a second substrate layer 106 can be located atop the ESL 104. The second substate layer 106 can be formed of silicon (Si), for example, although other suitable materials are also contemplated. The second substrate layer 106 can be a bulk silicon (Si) substrate, such as a silicon wafer. In alternative embodiments, the second substrate layer 106 can include other elementary semiconductors such as germanium (Ge); a compound semiconductor such as silicon carbide (SiC), gallium arsenide (GaAs), indium arsenide (InAs), and indium phosphide (InP); or an alloy semiconductor, such as SiGe, silicon germanium carbide (SiGeC), gallium arsenic phosphide (GaAsP), and gallium indium phosphide (GaInP). In some embodiments, the second substrate layer 106 can include SOI substrate, be strained and/or stressed for performance enhancement, include epitaxial regions, doped regions, and/or include other suitable features and layers. The second substate layer 106 can be formed using epitaxial epi growth.

A nanosheet stack (not shown prior to patterning) can firstly be patterned to form active regions 108 of the nanosheet stack and trenches 112. As shown in FIG. 2, the active regions 108 of the nanosheet stack, or stacked structure, are shown formed on the second substrate layer 106. The nanosheet stack can be formed through epitaxy, for example, such that the nanosheet stack forms crystalline layers. The nanosheet stack includes a plurality of semiconductor layers. The semiconductor layers can be made of materials having different lattice constants, and can include one or more layers of Si, Ge, SiGe, GaAs, indium antimonide (InSb), gallium phosphide (GaP), gallium antimonide (GaSb), etc., for example. In the embodiment shown, two sacrificial layers are included in the active regions 108 of the nanosheet stack, which are a first sacrificial layer 109 and a second sacrificial layer 111. The first sacrificial layer 109 is adjacent the second substrate layer 106, and the second sacrificial layer 111 is located above the first sacrificial layer 109 by a few layers. The first sacrificial layer 109 can be a SiGe layer having a germanium atomic percentage of 60, for example, The second sacrificial layer 111 can be a SiGe having a germanium atomic percentage of 30, for example.

After the nanosheet stack is patterned to form the active regions 108 and the trenches 112, the trenches 112 are formed into a plurality of shallow trench isolations (STIs) 117. The STIs 117 can be formed of a STI oxide fill 114 including a STI liner 116, such as silicon nitride (SiN), silicoboron carbonitride (SiBCN), silicon oxycarbonitride (SiOCN), silicon oxycarbide (SiOC), SiC, etc., and the STI oxide fill 114, followed by STI planarization and recess. After that, dummy gates 110 (three (3) are shown), that are each including a gate portion 113 and a hard mask portion 115, are located atop the active region 108.

Figure 3:
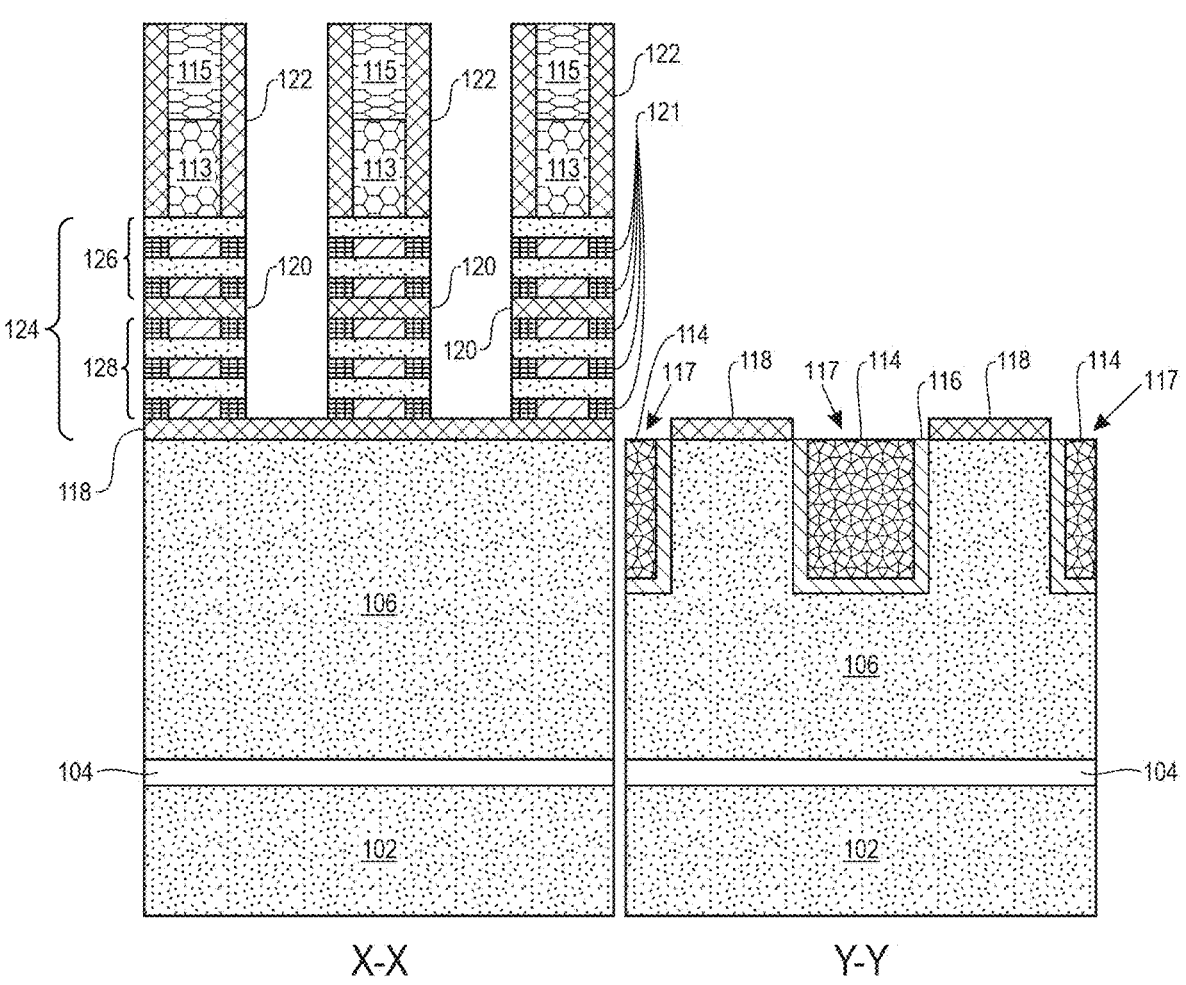

Turning to FIG. 3, a next operation (or operations) is shown in the process to form the semiconductor structure 100. The figure shows that the first sacrificial layer 109 (in FIG. 2) has been removed and replaced by a first spacer layer 118 (i.e., a bottom dielectric isolation (BDI) layer) and a middle dielectric isolation (MDI) layer 120. A benefit of the first spacer layer 118 is that it can reduce backside process damage or shorting risk to gate, which can result in an immunity to process variation, and can improve power-performance. The first spacer layer 118 and the MDI layer 120 can be made of, for example, $SiO_2$, SiOCN, SiOC, or SiBCN. In addition, the material used to form the first spacer layer 118 also forms a dummy gate liner 122 that lines the gate portions 113 and the hard mask portions 115. After that, the active regions 108 of the nanosheet stack are recessed, followed by SiGe indentation, and inner spacer portions 121 formation. As a result of the process, stacked FET columns 124 are formed that include a p-channel field effect transistor (pFET) region 126 and an n-channel field effect transistor (nFET) region 128 on both sides of the MDI layer 120, for example. Alternatively, the nFET region 128 and pFET region 126 (i.e., transistors) could be interchanged in positions, such that the nFET region 128 could be on the top and the pFET region 126 could be on the bottom, for example.

Figure 4:
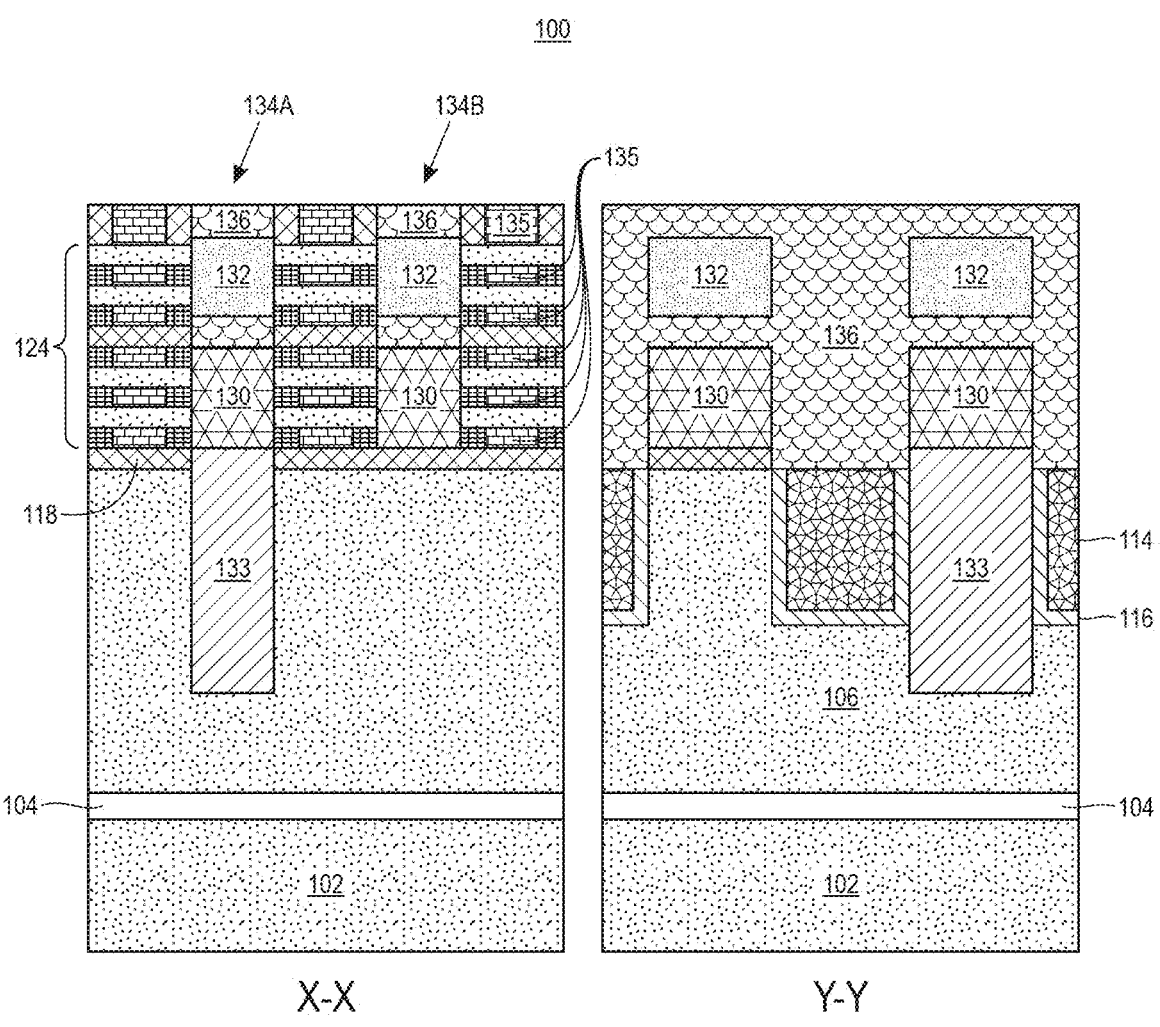

Turning to FIG. 4, a next operation (or operations) is shown in the process to form the semiconductor structure 100. From the frontside of the semiconductor structure 100, a sacrificial placeholder (otherwise knowns as a "placeholder") 133 is shown formed. The placeholder 133 can be formed by etching through the second substrate layer 106 to a predetermined depth, followed by deposition of a sacrificial placeholder material such as SiGe. Epitaxy can be performed in order to form bottom S/D epis 130 and top S/D epis 132. A first interlayer dielectric (ILD) layer 136 is also shown as being laid surrounding the bottom source/drain (S/D) epis 130 and top source/drain (S/D) epis 132. After that, an ILD CMP process is done to expose the dummy gates 110, followed by dummy gate 110 removal and sacrificial SiGe nanosheet removal. In addition, the figure shows replacement high-k metal gate (HKMG) 135 formation. The HKMG 135 can be made of a gate insulator material, such as hafnium oxide ($HfO_2$), $HfLaO_x$, $HfAlO_x$, $HfSiO_x$, $HfTaO_x$, etc., and gate metals including work function metals such as titanium nitride (TiN), titanium alumunide (TiAl), TiAlC, etc., and conductive metal fill materials, such as tungsten (W).

Figure 5:
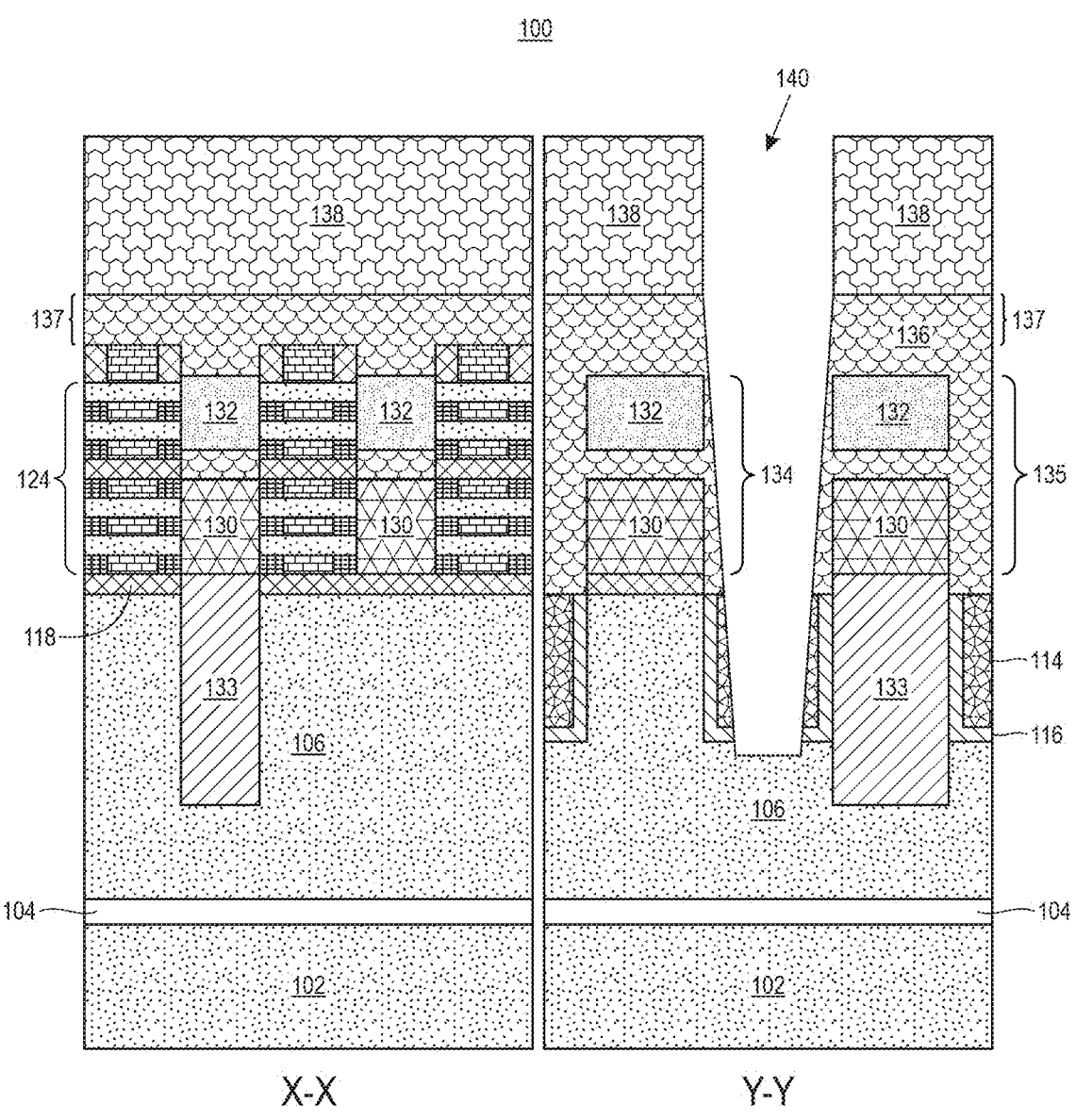

In FIG. 5, a next operation (or operations) is shown in the process to form the semiconductor structure 100. A second ILD layer 137 is deposited on top of the semiconductor structure 100 and above the first ILD layer 136. A cutting mask, known as an organic planarization layer (OPL) 138, is then used to cut a gate cut trench 140 that separates two devices (the first S/D epi 134A, and the second S/D epi 134B). The gate cut trench 140 cuts through the STI oxide fill 114 of the at least one of the plurality of STIs 117 and through a bottom of the STI liner of the at least one of the plurality of STIs 117. The OPL 138 can be formed utilizing a deposition process such as, for example, spin-on, CVD, PECVD, evaporation, chemical solution deposition and other like deposition techniques. The gate cut trench 140 is then cut in order to separate the first S/D epi 134A (a first complementary metal-oxide-semiconductor (CMOS) cell) and the second S/D epi 134B (a second CMOS cell) (as shown in Y-Y cross-sectional view). This process is otherwise referred to as "gate cut patterning." Each of the first and second S/D epis 134A, 134B were made of the bottom epi 130 and the top epi 132.

Figure 6:
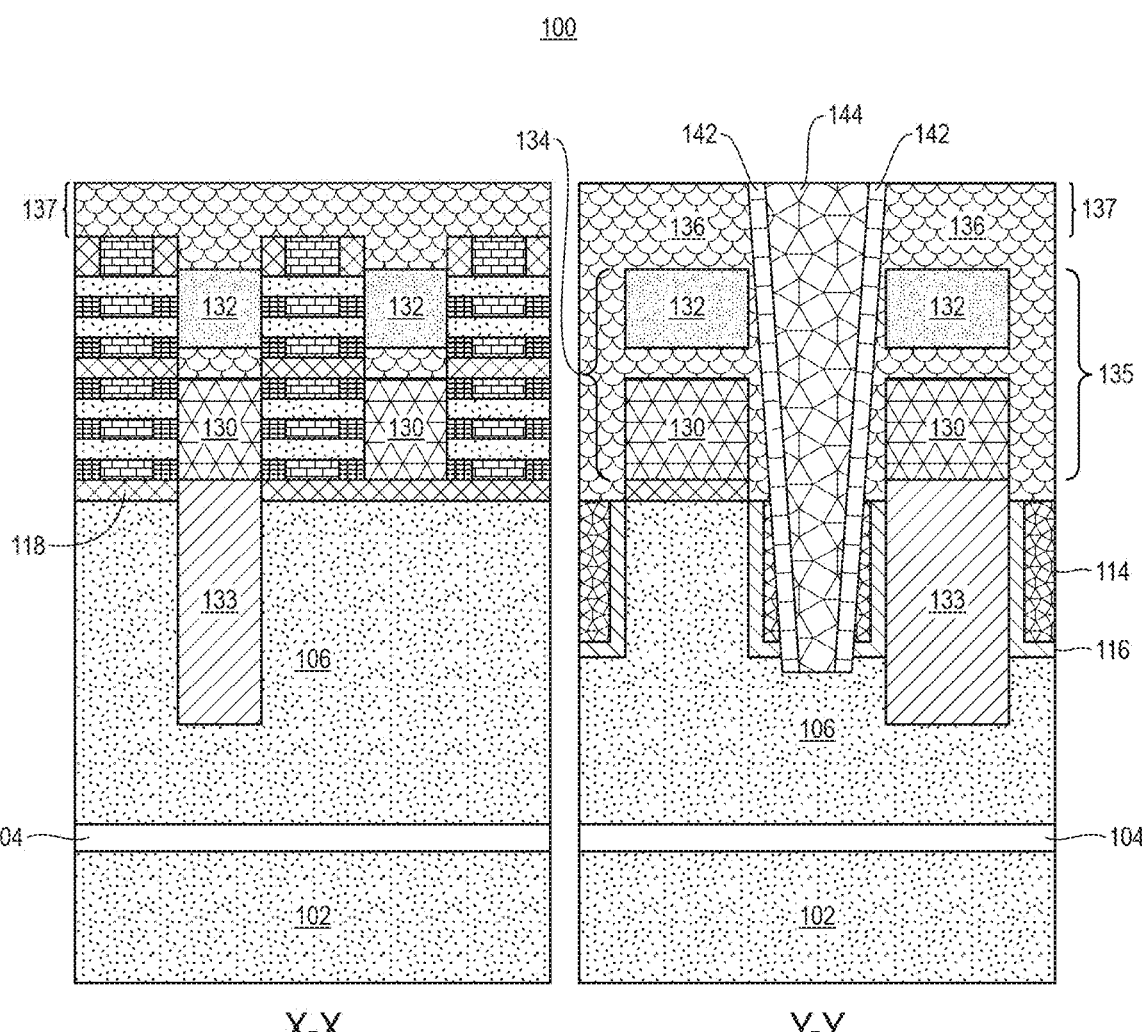

In FIG. 6, a next operation (or operations) is shown in the process to form the semiconductor structure 100. A bi-layer gate fill is formed in the gate cut trench 140 (in FIG. 5) including a gate cut liner 142 and a gate cut fill 144. The materials that can be used for the gate cut liner 142 include, but are not limited to, SiN, SiBCN, SiOCN, SiOC, SiC, etc. The materials that can be used for the gate cut fill 144 include, but are not limited to SiO$_2$, low-k oxide, etc.

Figure 7:
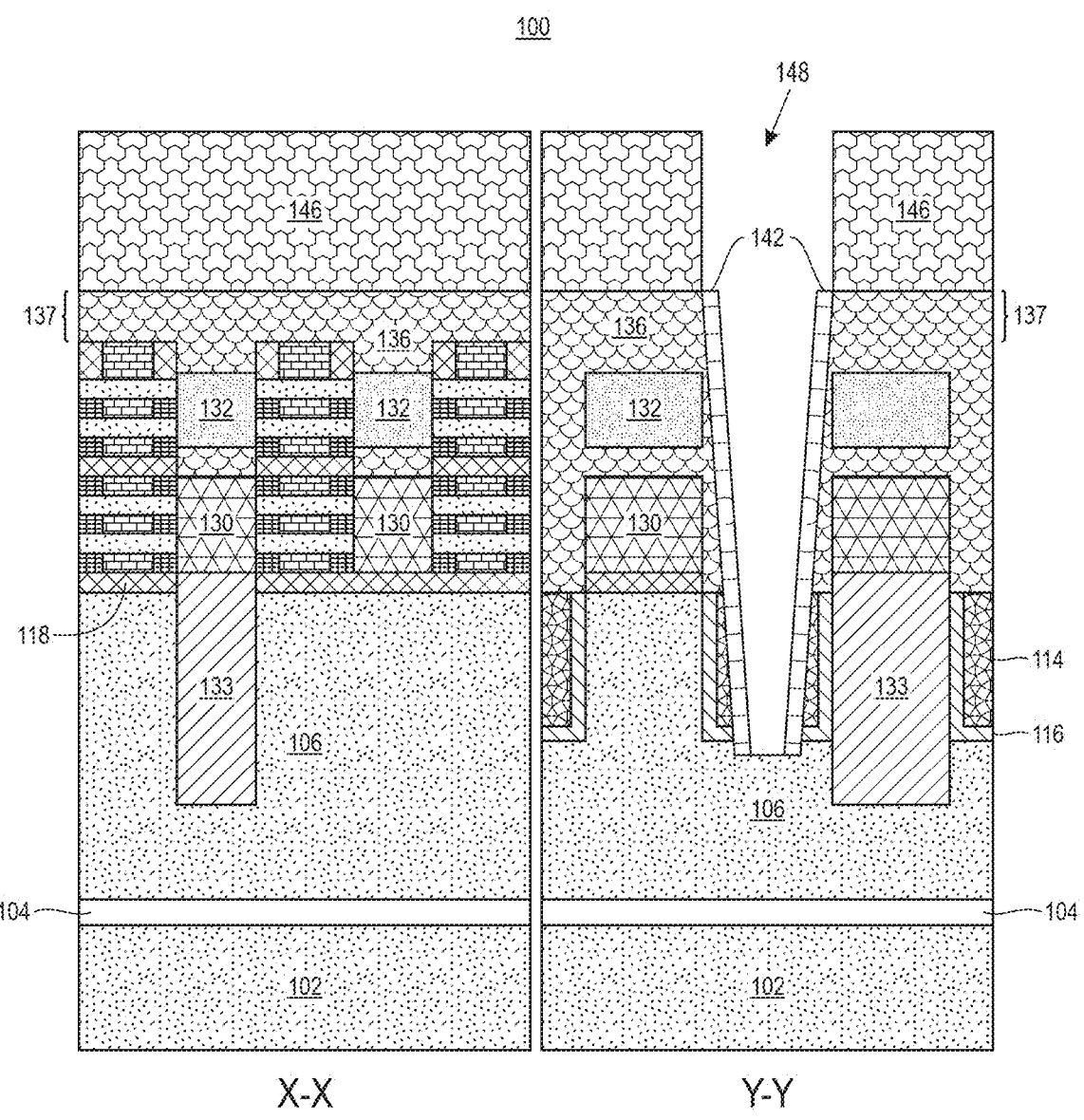

In FIG. 7, a next operation (or operations) is shown in the process to form the semiconductor structure 100. Another cutting mask, known as a second OPL 146, is used to pattern a self-aligned trench 148. Only a portion of the bi-layer gate fill shown in FIG. 6 (made of the gate cut liner 142 and the gate cut fill 144) is removed. The second OPL 146 can be formed utilizing a deposition process such as, for example, spin-on, CVD, PECVD, evaporation, chemical solution deposition and other like deposition techniques.

Figure 8:
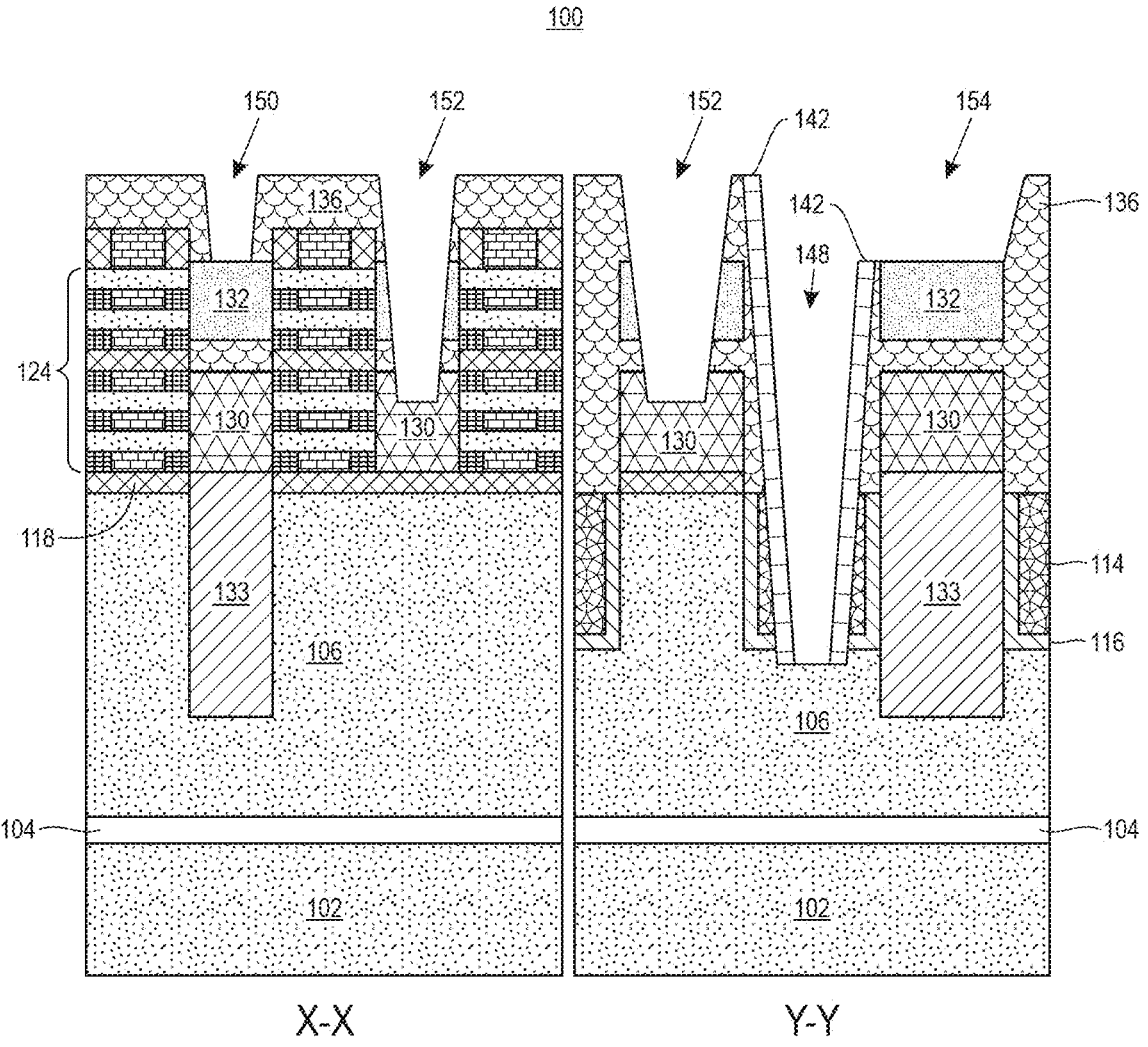
Figure 9:
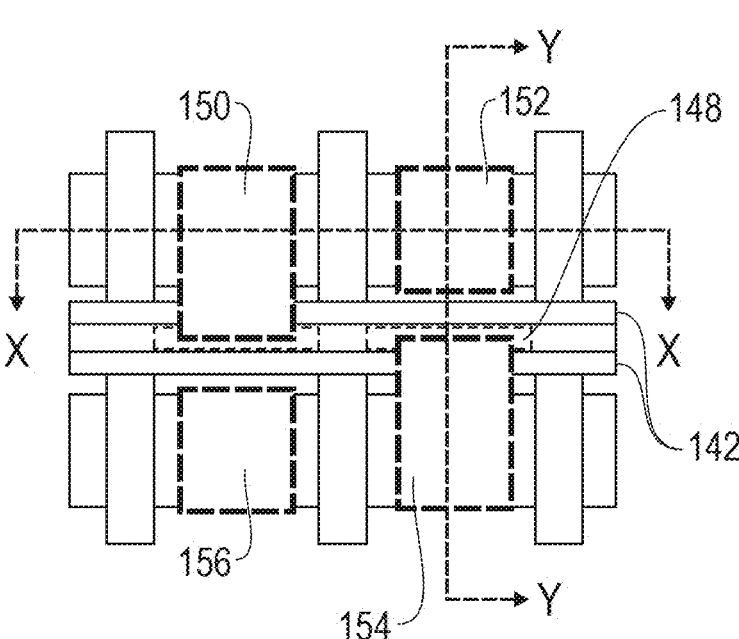
FIG. 9 illustrates a top view of the integrated circuit (IC) structure disclosed herein and includes locations of where two cross-sections are taken (at X-X and at Y-Y) that are shown in cross-sectional views in the following FIG. 10, in accordance with embodiments of the disclosure.

In FIGS. 8-9, a next operation (or operations) is shown in the process to form the semiconductor structure 100. The figures show cross-sectional views (FIG. 8) and a top view (FIG. 9) of the semiconductor structure 100 after patterning was performed in order to form a plurality of contact openings (a first contact opening 150, a second contact opening 152, a third contact opening 154 and a fourth contact opening 156 are shown). A process that can be used to open the contact openings 150, 152, 154, 156 includes, for example, selective etching (such as conventional lithography patterning followed by a dry etch process).

Figure 10:
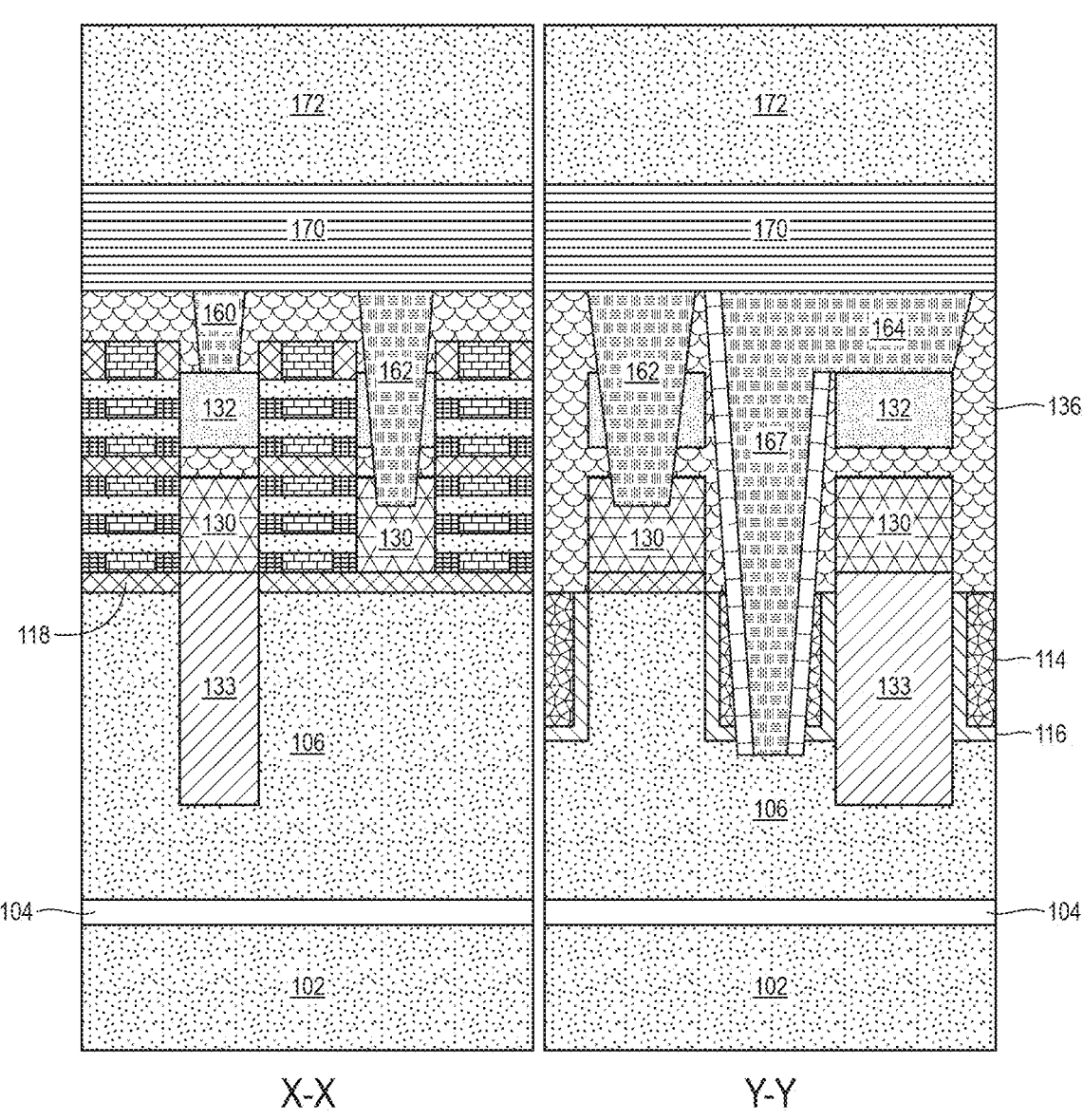
FIG. 10 illustrates two cross-sectional views of the IC structure of FIG. 9, taken at X-X and Y-Y (as shown in FIG. 9), with the two views X-X and Y-Y shown side-by-side, and taken at various operations or stages in a process or method to form the IC structure as disclosed herein, in accordance with embodiments of the disclosure.
Figure 11:
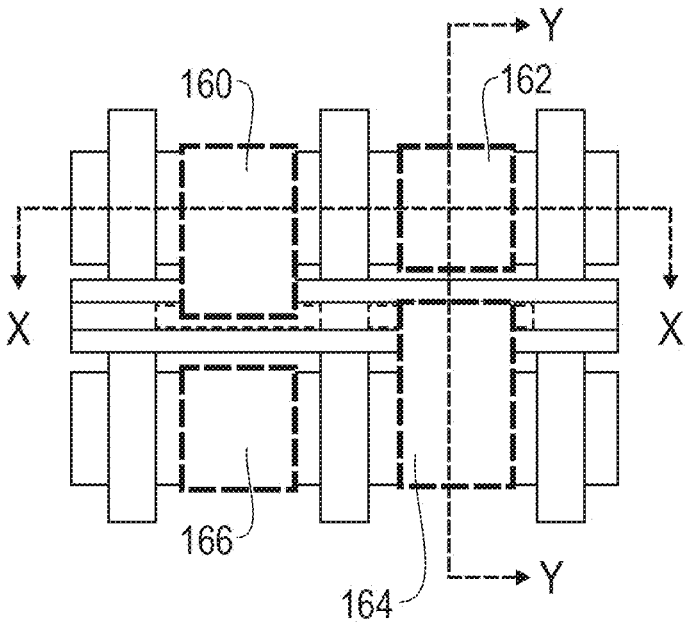
FIG. 11 illustrates a top view of the integrated circuit (IC) structure disclosed herein and includes locations of where two cross-sections are taken (at X-X and at Y-Y) that are shown in cross-sectional views in the following FIG. 10, in accordance with embodiments of the disclosure.

In FIGS. 10-11, a next operation (or operations) is shown in the process to form the semiconductor structure 100. The figures show cross-sectional views (FIG. 10) and a top view (FIG. 11) of the semiconductor structure 100 after a metallization process is performed in the middle-of-line portion of the semiconductor structure 100 to form four (4) contacts (a first contact 160, a second contact 162, a third contact 164 and a fourth contact 166). The third contact 164 includes a portion located above and in contact with the top epi 132 and another portion that is a top source/drain (S/D) middle-of-line (MOL) contact via (otherwise known as a "deep via") 167 (FIG. 10) that extends down into the self-aligned trench 148 (in FIG. 8). The first contact 160 is in contact with the bottom epi 130. The metallization process, in order to form the contacts 160, 162, 164, 166 in FIGS. 10-11, was followed by a BEOL layer 170 being formed on the frontside of a carrier wafer 172. The BEOL layer 170 can include multiple layers of metal liner levels and vias surrounded by dielectrics such as low-k dielectric. The contacts 160, 162, 164, 166 can be made of a silicide liner, such as titanium (Ti), nickel (Ni), NiPt, a thin metal adhesion layer, such as TiN, and conductive metal fill, such as W, ruthenium (Ru), cobalt (Co), etc.

Figure 12:
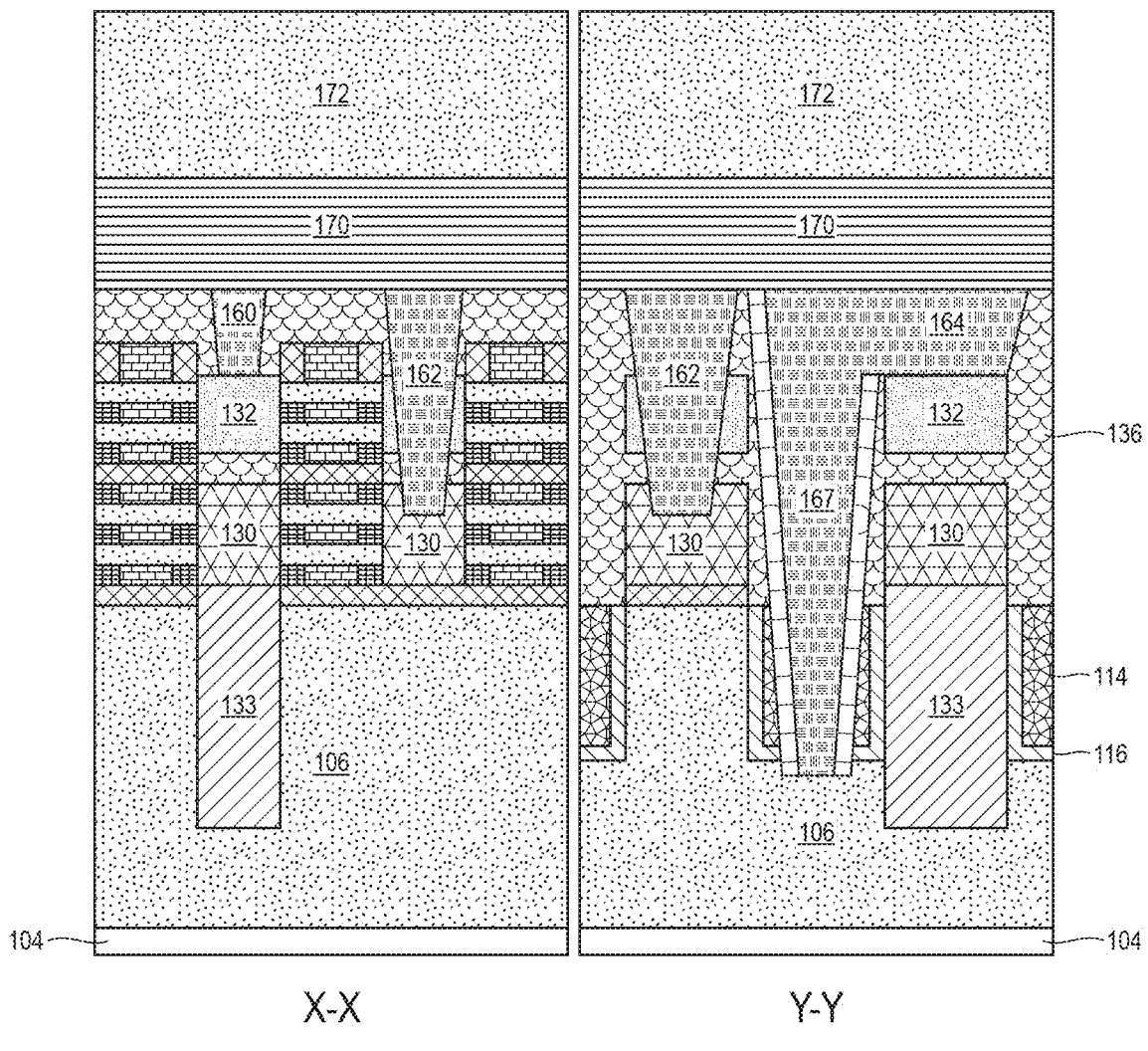
FIGS. 12-18 illustrate two cross-sectional views of the IC structure of FIG. 11, taken at X-X and Y-Y (as shown in FIG. 11), with the two views X-X and Y-Y shown side-by-side, and taken at various operations or stages in a process or method to form the IC structure as disclosed herein, in accordance with embodiments of the disclosure.

In FIG. 12, a next operation (or operations) is shown in the process to form the semiconductor structure 100. After the semiconductor structure 100 as in FIG. 10, a carrier wafer flip process was performed (involving the carrier wafer 172), in which the substrate 102 (shown in FIG. 10) was removed, stopping at the ESL 104.

Figure 13:
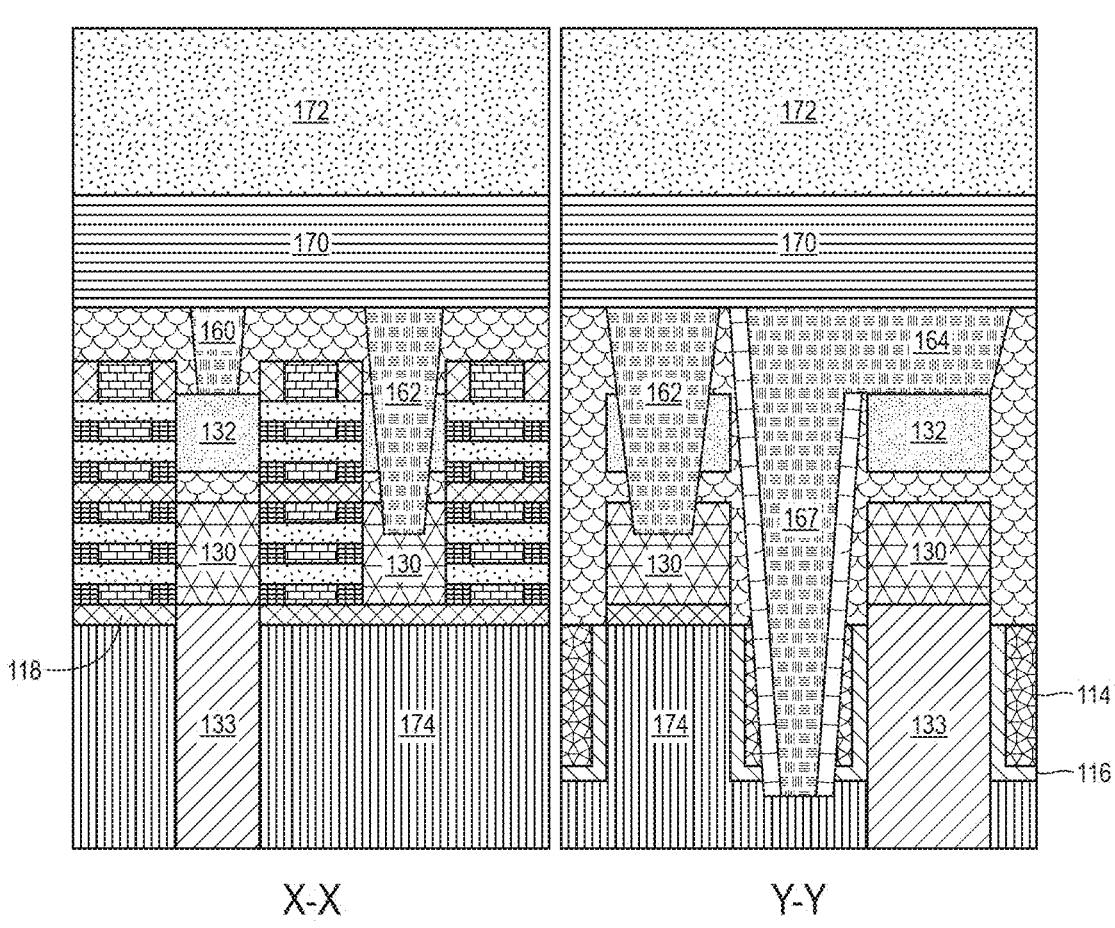

In FIG. 13, a next operation (or operations) is shown in the process to form the semiconductor structure 100. After the semiconductor structure 100 as in FIG. 12, the ESL 104 (shown in FIG. 12) was removed. In addition, remaining Si in the second substrate layer 106 (shown in FIG. 12) was removed by, for example, selective dry and wet etch processes, and a BILD layer 174 was formed in areas surrounding the placeholder 133, followed by CMP. The BILD layer 174 can be formed of any suitable isolating material, such as SiO$_2$, SiOC, SiON, etc.

Figure 14:
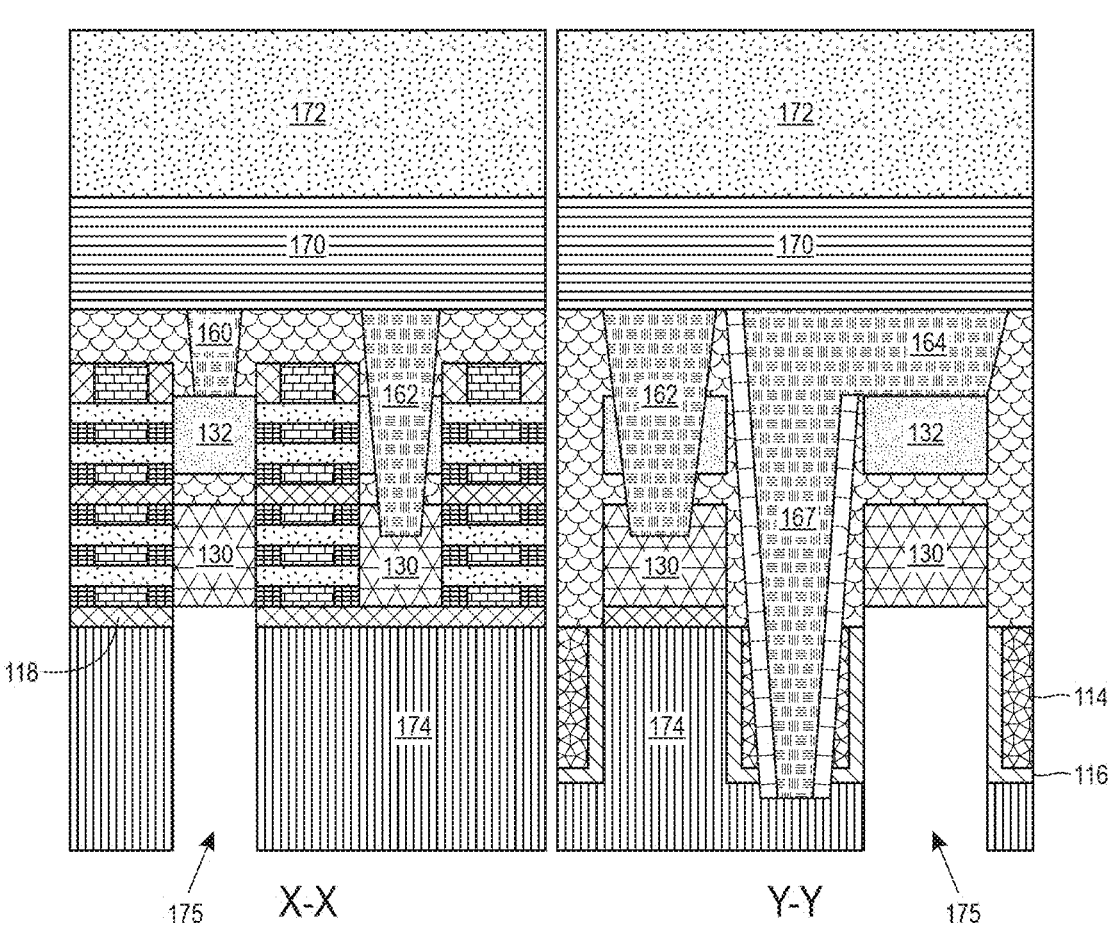

In FIG. 14, a next operation (or operations) is shown in the process to form the semiconductor structure 100. After the semiconductor structure 100 as in FIG. 13, the placeholder 133 (shown in FIG. 13) is removed using RIE or another suitable etch processing, leaving behind a placeholder opening 175.

Figure 15:
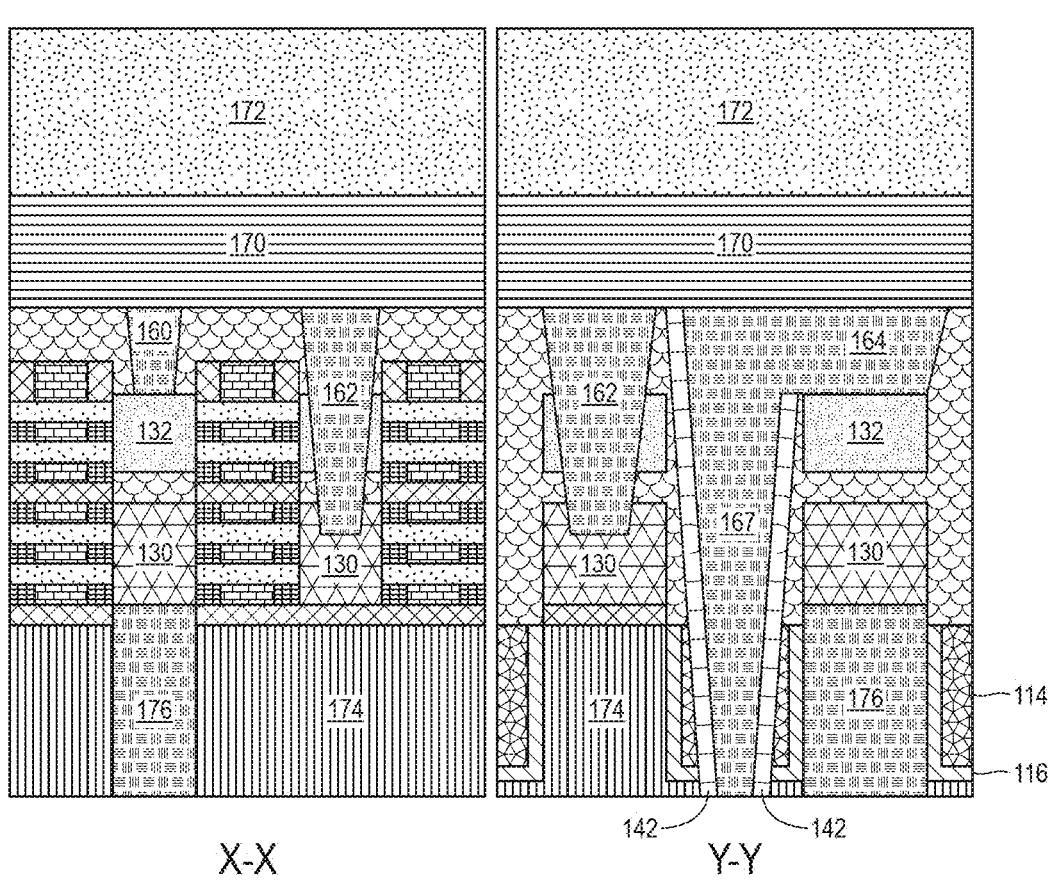

In FIG. 15, a next operation (or operations) is shown in the process to form the semiconductor structure 100. After the semiconductor structure 100 as in FIG. 14, a backside contact 176 was formed in the placeholder opening 175 (shown in FIG. 14) in the BILD layer 174 by using metal deposition processes, including PVD, ALD, CVD, plating, etc., followed by CMP. A bottom portion of the BILD layer 174 was removed during the process. The suitable metal of the backside contact 176 can include a silicide layer such as titanium (Ti), nickel (Ni), nickel platinum (NiPt), etc., a metal adhesion layer (e.g., such as TiN) and a low resistance metal such as ruthenium (Ru), tungsten (W), cobalt (Co) or another suitable material.

Figure 16:
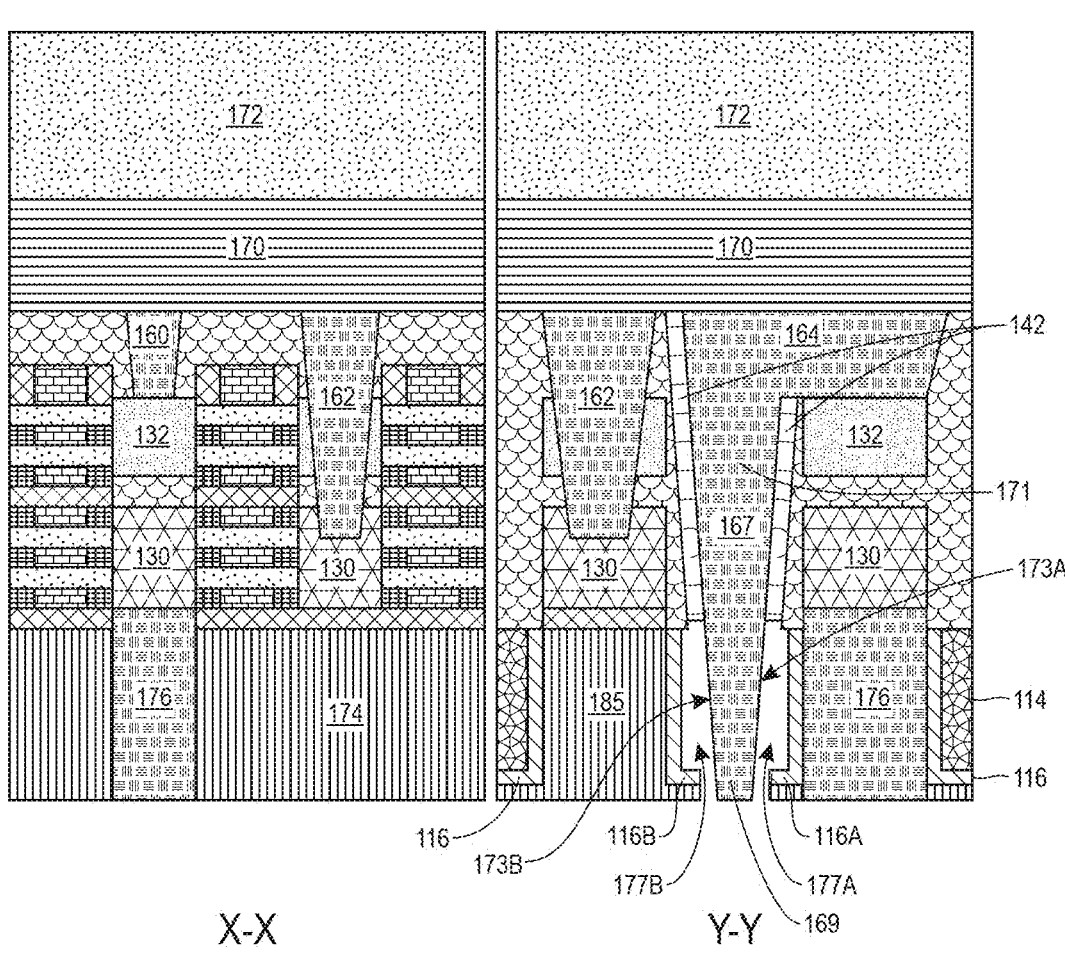

In FIG. 16, a next operation (or operations) is shown in the process to form the semiconductor structure 100. After the semiconductor structure 100 as in FIG. 15, a selective etch process is implemented to etch the gate cut liner 142, followed by additional selective etching process to remove any exposed STI oxide fill 114 near the gate cut liner 142, in order to form a first cavity 177A on a first side 173A of a lower portion 169 of the top S/D MOL contact via 167 between the lower portion 169 of the top S/D MOL contact via 167 and a first sidewall 116A of the STI liner 116, and a second cavity 177B on a second side 173B of the top S/D MOL contact via 167 between the second side 173B of the top S/D MOL contact via 167 and a second sidewall 116B of the STI liner 116 (and not an upper portion 171 of the top S/D MOL contact via 167).

Figure 17:
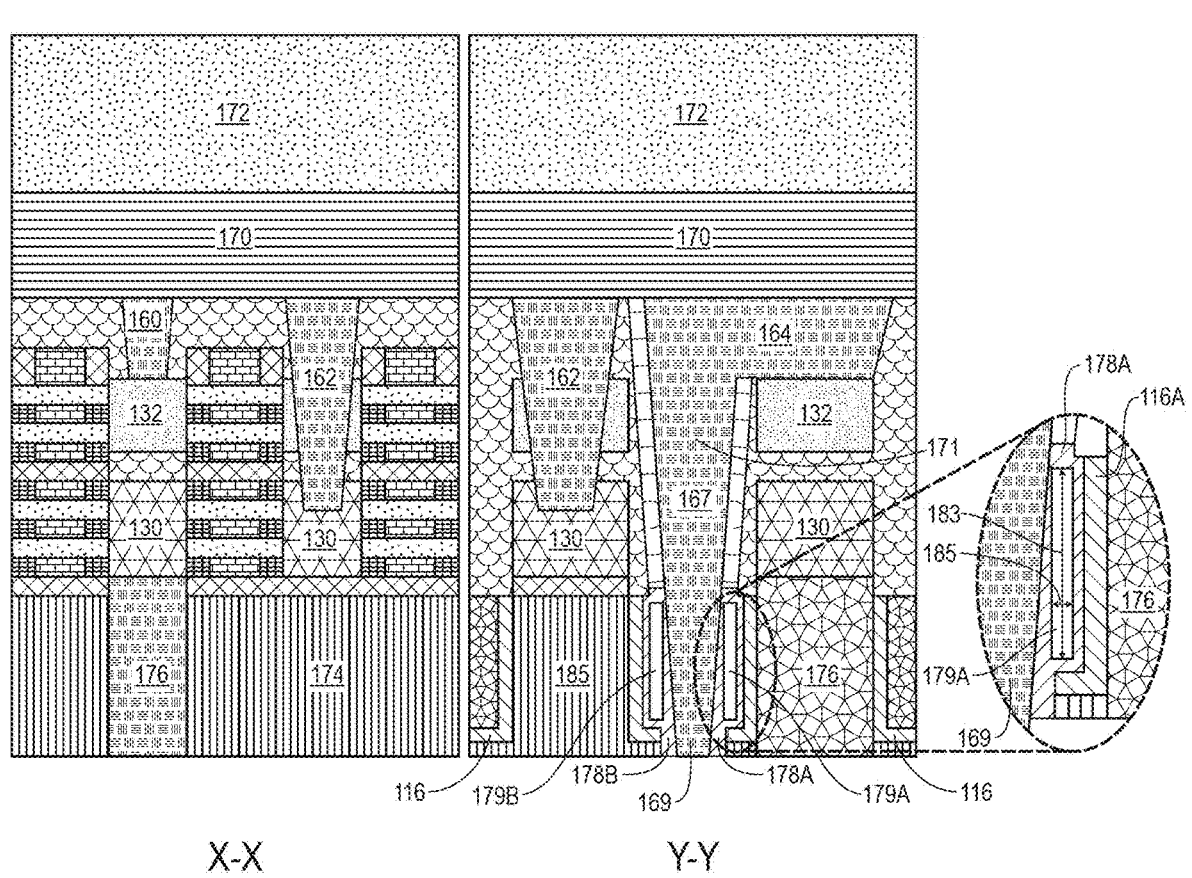

In FIG. 17, a next operation (or operations) is shown in the process to form the semiconductor structure 100. After the semiconductor structure 100 as in FIG. 16, a first and a second dielectric material liner 178A, 178B, respectively, were formed by ALD deposition to seal a small gap opening, followed by an etching back process (such as an isotropic dry or a wet etch process), in order to pinch off (or close) and form a first air gap 179A on the first side 173A (shown in FIG. 16) of the lower portion 169 of the top S/D MOL contact via 167, between the lower portion 169 of the top S/D MOL contact via 167 and the first sidewall 116A of the STI liner 116, and a second air gap 179B on the second side 173B (shown in FIG. 16) of the top S/D MOL contact via 167 between the second side 173B of the top S/D MOL contact via 167 and the second sidewall 116B of the STI liner 116. The lower portion 169 of the S/D MOL contact via 167 is located towards a backside of the semiconductor structure 100, and the upper portion 171 is located towards a frontside of the semiconductor structure 100. The dielectric material liners 178A, 178B can be made of any suitable material including, but not limited to, SiO$_2$, low-k oxide, SiN, SiBCN, SiOC, SiOCN, etc.

The first and second air gaps 179A, 179B can have a width in a range from about 2 nanometers (nm) to about 10 nm and a length in a range from about 10 nm to about 50 nm. The term "length" is described as the portion of the air gaps 179A, 179B that runs substantially parallel to the top S/D MOL contact via 167 as it extends through the semiconductor structure 100 (between the BEOL layer 70 and a backside power rail (BPR) 180 (shown in FIG. 18)), and is indicated in FIG. 17 by an arrow and a numeral 183 in a blown up portion of FIG. 17 including the first air gap 179A as an example. The term "width" is described as the portion of the air gaps 179A, 179B that runs substantially perpendicular to the top S/D MOL contact via 167 as it extends through the semiconductor structure 100 and is indicated in FIG. 17 by an arrow and a numeral 185 in the blown-up portion of FIG. 17 including the first air gap 179A as an example. Other suitable widths and lengths are contemplated, however, and are not limited to those provided herein.

Figure 18:
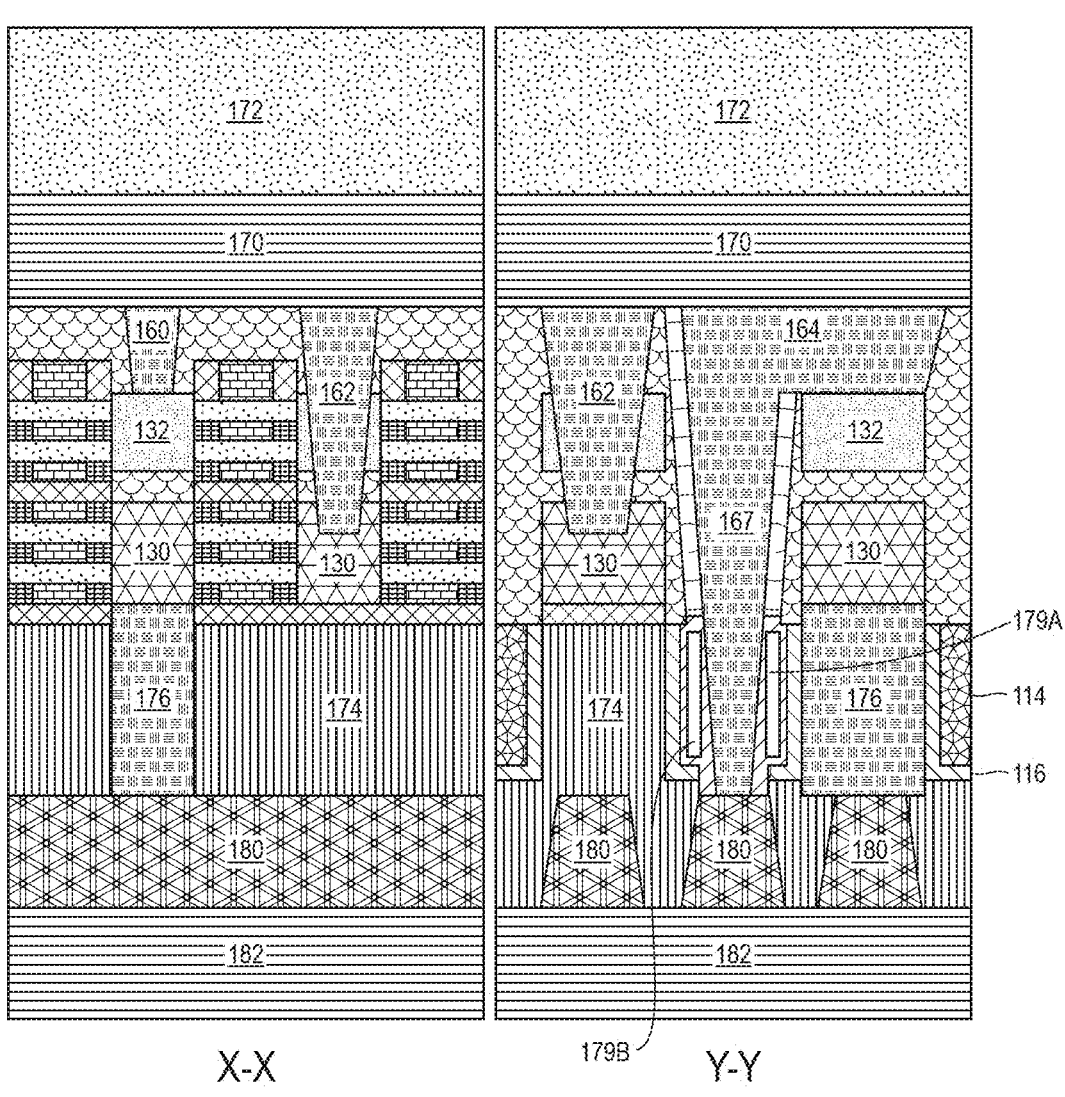

In FIG. 18, a next operation (or operations) is shown in the process to form the semiconductor structure 100. After the semiconductor structure 100 as in FIG. 17, a backside power rail (BPR) 180 was formed using a backside metallization layer process and making contact with the backside contact 176. Also, a backside power distribution network (BSPDN) 182 was formed by a conventional copper damascene process.

In FIG. 19, a flow diagram of a method 200 of forming a semiconductor structure (such as the semiconductor structure 100 of FIG. 18) is shown. The method 200 includes an operation 210 of forming a plurality of shallow trench isolations (STIs) 117, each of the plurality of STIs including a shallow trench isolation (STI) liner 116 and a STI oxide fill 114. The method 200 also includes an operation 220 of forming a gate cut trench 140 extending into at least one of the plurality of STIs 117, wherein the gate cut trench 140 cuts through the STI oxide fill 114 of the at least one of the plurality of STIs 117 and through a bottom of the STI liner 116 of the at least one of the plurality of STIs 117. In addition, the method 200 also includes an operation 230 of forming a gate cut liner 142 and a gate cut fill 144 in the gate cut trench 140. The method includes an operation 240 of forming a S/D MOL contact via 167 through the gate cut fill 144 including a first backside contact 164 within the top S/D MOL contact via 167. The method further includes an operation 250 of selectively removing a portion of the gate cut liner 142 and a portion of the STI oxide fill 114 located near the portion of the gate cut liner 142 in order to form a first cavity 177A on a first side 173A of the top S/D MOL contact via 167 and a second cavity 177B on a second side 173B of the top S/D MOL contact via 167. Additionally, the method includes an operation 260 of depositing a dielectric material liner 178A, 178B within each of the first cavity 177A and the second cavity 177B in order to seal each of the first cavity 177A and the second cavity 177B. The method includes an operation 270 of forming a first air gap 179A adjacent the first side 173A of the top S/D MOL contact via 167 and a second air gap 179B adjacent the second side 173B of the top S/D MOL contact via 167. In addition, the forming the first air gap 179A and the forming the second air gap 179B operation (operation 270) includes removing portions of the gate cut liner 142 on the first side 173A and the second side 173B of the top S/D MOL contact via 167. The method can further include operations of forming a BEOL layer 170, and forming a BPR 180, wherein the top S/D MOL contact via 167 extends between the BEOL layer 170 and the BPR 180. The method can also include an operation of forming a plurality of metal contacts 160, 162, 165, 166.

In some embodiments, a semiconductor structure 100 includes a top S/D MOL contact via 167 including a first side and a second side 173A, 173B. The structure includes a first air gap 179A located adjacent the first side 173A of the top S/D MOL contact via 167, and a second air gap 179B located adjacent the second side 173B of the top S/D MOL contact via 167. The top S/D MOL contact via 167 can include an upper portion 171 and a lower portion 169 and the first air gap 179A and the second air gap 179B are adjacent the lower portion 169 of the top S/D MOL contact via 167 and adjacent a backside contact 176. The first air gap 179A and the second air gap 179B can each include a dielectric material liner 178A, 179B, respectively. The dielectric material liners 178A, 178B can fully line each of the first air gap 179A and the second air gap 179B. The first air gap 179A and the second air gap 179B can each have a width 185 in a range from 2 nm to 10 nm and a length 183 in a range from 10 nm to 50 nm. The first air gap 179A can be located between the top S/D MOL contact via 167 and an adjacent backside contact 176 and the second air gap 179B is located between the top S/D MOL contact via 167 and an adjacent shallow trench isolation (STI) 187. The semiconductor structure 100 can further include a BEOL layer 170 and BPR 180, wherein the top S/D MOL contact via 167 extends between the BEOL layer 170 and the BPR 180.

In some embodiments, a semiconductor structure 100 includes a top S/D MOL contact via 167 including an upper portion 171 and a lower portion 169 adjacent a backside contact 176. The semiconductor structure 100 includes a gate cut liner 142 located adjacent the upper portion 171 of the top S/D MOL contact via 167 on a first side 173A and a second side 173B of the top S/D MOL contact via 167. A first air gap 179A and a second air gap 179B located adjacent the first side 173A and the second side 173B of the top S/D MOL contact via 167 along the lower portion 169 of the top S/D MOL contact via 167. The first air gap 179A and the second air gap 179B each include a dielectric material liner 178A, 178B, respectively. The semiconductor structure 100 can include a BEOL layer 170 and a BPR 180, wherein the top S/D MOL contact via 167 extends between the BEOL layer 170 and the BPR 180. The first air gap 179A can be is located between the top S/D MOL contact via 167 and a backside contact 176 and the second air gap 179B can be located between the top S/D MOL contact via 167 and a shallow trench isolation (STI) 187. The semiconductor structure 100 can include a gate cut liner 42 located on the first side 173A and the second side 173B of the upper portion 171 of the top S/D MOL contact via 167. The first air gap 179A and the second air gap 179B can each have a width 185 in a range from 2 nm to 10 nm and a length 183 in a range from 10 nm to 50 nm.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a top source/drain (S/D) middle-of-line (MOL) contact via including a first side and a second side;
a first air gap located adjacent the first side of the top S/D MOL contact via; and
a second air gap located adjacent the second side of the top S/D MOL contact via.

2. The semiconductor structure of claim 1, wherein the top S/D MOL contact via includes an upper portion and a lower portion and the first air gap and the second air gap are adjacent the lower portion of the top S/D MOL contact via and adjacent a backside contact of the semiconductor structure.

3. The semiconductor structure of claim 1, wherein the first air gap and the second air gap each include a dielectric material liner.

4. The semiconductor structure of claim 3, wherein the dielectric material liner closes the first air gap and the second air gap.

5. The semiconductor structure of claim 1, wherein the first air gap and the second air gap each have a width in a range from 2 nm to 10 nm.

6. The semiconductor structure of claim 1, wherein the first air gap and the second air gap each have a length in a range from 10 nm to 50 nm.

7. The semiconductor structure of claim 1, wherein the first air gap is located between the top S/D MOL contact via and an adjacent backside contact and the second air gap is located between the top S/D MOL contact via and an adjacent shallow trench isolation (STI).

8. The semiconductor structure of claim 1, further comprising:
a back end-of-line (BEOL) layer; and
a backside power rail (BPR),
wherein the top S/D MOL contact via extends between the BEOL layer and the BPR.

9. A semiconductor structure, comprising:
a top source/drain (S/D) middle-of-line (MOL) contact via including an upper portion and a lower portion adjacent a backside contact;
a dielectric material layer located adjacent the upper portion of the top S/D MOL contact via on a first side and a second side of the top S/D MOL contact via; and
a first air gap and a second air gap located adjacent the first side and the second side of the top S/D MOL contact via along the lower portion of the top S/D MOL contact via.

10. The semiconductor structure of claim 9, wherein the first air gap and the second air gap each include a dielectric material liner.

11. The semiconductor structure of claim 9, further comprising:
a back end-of-line (BEOL) layer; and
a backside power rail (BPR), wherein the top S/D MOL contact via extends between the BEOL layer and the BPR.

12. The semiconductor structure of claim 9, wherein the first air gap is located between the top S/D MOL contact via and the backside contact and the second air gap is located between the top S/D MOL contact via and a shallow trench isolation (STI).

13. The semiconductor structure of claim 9, further comprising:
a gate cut liner located on the first side and the second side of the upper portion of the top S/D MOL contact via.

14. The semiconductor structure of claim 9, wherein the first air gap and the second air gap each have a width in a range from 2 nm to 10 nm.

15. The semiconductor structure of claim 9, wherein the first air gap and the second air gap each have a length in a range from 10 nm to 50 nm.

16. A method of forming a semiconductor structure, the method comprising:
forming a plurality of shallow trench isolations (STIs), each of the plurality of STIs including a shallow trench isolation (STI) liner and a STI oxide fill;
forming a gate cut trench extending into at least one of the plurality of STIs, wherein the gate cut trench cuts through the STI oxide fill of the at least one of the plurality of STIs and through a bottom of the STI liner of the at least one of the plurality of STIs;
forming a gate cut liner and a gate cut fill in the gate cut trench;
forming a top source/drain (S/D) middle-of-line (MOL) contact via through the gate cut fill including a first backside contact within the top S/D MOL contact via;
selectively removing a portion of the gate cut liner and a portion of the STI oxide fill located near the portion of the gate cut liner in order to form a first cavity on a first side of the top S/D MOL contact via and a second cavity on a second side of the top S/D MOL contact via;
depositing a dielectric material liner within each of the first cavity and the second cavity in order to seal each of the first cavity and the second cavity; and forming a first air gap adjacent the first side of the top S/D MOL contact via and a second air gap adjacent the second side of the top S/D MOL contact via.

17. The method of claim 16, wherein the first air gap is located between the top S/D MOL contact via and a backside contact and the second air gap is located between the top S/D MOL contact via and one of the plurality of STIs.

18. The method of claim 16, wherein the forming the first air gap and the forming the second air gap steps include removing portions of the gate cut liner on the first side and the second side of the top S/D MOL contact via.

19. The method of claim 16, further comprising:
forming a back end-of-line (BEOL) layer; and
forming a backside power rail (BPR),
wherein the top S/D MOL contact via extends between the BEOL layer and the BPR.

20. The method of claim 16, further comprising:
forming a plurality of metal contacts.

* * * * *